United States Patent
Tseng et al.

(10) Patent No.: US 9,530,660 B2
(45) Date of Patent: Dec. 27, 2016

(54) MULTIPLE DIRECTED SELF-ASSEMBLY PATTERNING PROCESS

(71) Applicant: Taiwan Semiconductor Manufacturing Company, Ltd., Hsin-Chu (TW)

(72) Inventors: Chin-Yuan Tseng, Hsin-Chu (TW); Chi-Cheng Hung, Miaoli County (TW); Chun-Kuang Chen, Hsinchu County (TW); Kuan-Hsin Lo, Nantou County (TW); Ru-Gun Liu, Hsinchu County (TW); Tsai-Sheng Gau, HsinChu (TW); Wei-Liang Lin, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/713,207

(22) Filed: May 15, 2015

(65) Prior Publication Data

US 2016/0336186 A1    Nov. 17, 2016

(51) Int. Cl.
| | |
|---|---|
| H01L 21/44 | (2006.01) |
| H01L 21/8228 | (2006.01) |
| G03G 5/00 | (2006.01) |
| H01L 21/308 | (2006.01) |
| H01L 21/768 | (2006.01) |

(52) U.S. Cl.
CPC ....... *H01L 21/3081* (2013.01); *H01L 21/3085* (2013.01); *H01L 21/3086* (2013.01); *H01L 21/76816* (2013.01)

(58) Field of Classification Search
CPC .......... H01L 21/3081; H01L 21/76816; H01L 21/3085; H01L 21/3086; C08J 7/00
USPC ......................................... 438/666; 430/323
See application file for complete search history.

(56) References Cited

U.S. PATENT DOCUMENTS

| | | | |
|---|---|---|---|
| 8,039,179 | B2 | 10/2011 | Shieh et al. |
| 8,202,681 | B2 | 6/2012 | Lin et al. |
| 8,728,332 | B2 | 5/2014 | Lin et al. |
| 8,822,243 | B2 | 9/2014 | Yan et al. |
| 8,871,408 | B2 | 10/2014 | Takekawa et al. |
| 8,956,808 | B2 * | 2/2015 | Schmid ................. 430/323 |
| 2006/0091468 | A1 | 5/2006 | Liaw | 
| 2011/0281208 | A1 | 11/2011 | Lin et al. |
| 2012/0278776 | A1 | 11/2012 | Lei et al. |

(Continued)

OTHER PUBLICATIONS

Roel Gronheid et al., "Addressing the Challenges of Directed Self Assembly Implementation," IMEC 2011, Litho Extensions Symposium Oct. 20, 2011, Miami USA. 21 pages.

(Continued)

*Primary Examiner* — David S Blum
(74) *Attorney, Agent, or Firm* — Haynes and Boone, LLP

(57) ABSTRACT

Disclosed is a method of forming a target pattern for a semiconductor device using multiple directed self-assembly (DSA) patterning processes. The method includes receiving a substrate and forming a guide pattern over the substrate by performing a process that includes a first DSA process. The method further includes performing a second DSA process over the substrate using the guide pattern. In an embodiment, the first DSA process controls the first pitch of a dense pattern in a first direction and the second DSA process controls the second pitch of the dense pattern in a second direction.

20 Claims, 18 Drawing Sheets

(56) References Cited

U.S. PATENT DOCUMENTS

| | | |
|---|---|---|
| 2013/0295769 A1 | 11/2013 | Lin et al. |
| 2013/0320451 A1 | 12/2013 | Liu et al. |
| 2014/0065839 A1 | 3/2014 | Kawanishi et al. |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264896 A1 | 9/2014 | Lu et al. |
| 2014/0264899 A1 | 9/2014 | Chang et al. |
| 2014/0273442 A1 | 9/2014 | Liu et al. |
| 2014/0273446 A1 | 9/2014 | Huang et al. |
| 2014/0295669 A1 | 10/2014 | Kawanishi et al. |
| 2015/0099362 A1 | 4/2015 | Light et al. |
| 2016/0060410 A1* | 3/2016 | Kobayashi ............... C08J 7/00 216/49 |

OTHER PUBLICATIONS

Delgadillo et al., "All Track Directed Self-Assembly of Block Copolymers: Process Flow and Origin of Defects," Proc. SPIE 8323, Alternative Lithographic Technologies IV, 83230D (Mar. 1, 2012), 9 pages.

Chi-Chun Liu et al., "Fabrication of Lithographically Defined Chemically Patterned Polymer Brushes and Mats," Macromolecules, 2011, 44 (7), pp. 1876-1885, ACS Publications, 2011 American Chemical Society.

* cited by examiner

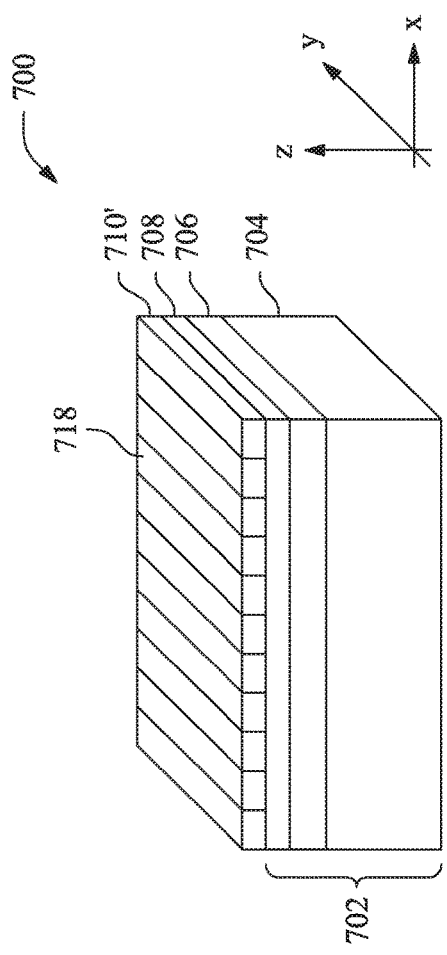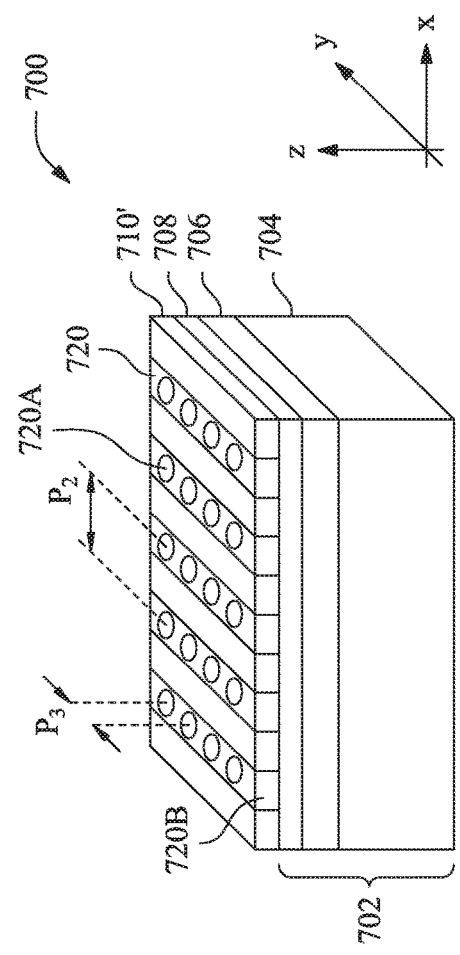
FIG. 7G
FIG. 7H

MULTIPLE DIRECTED SELF-ASSEMBLY PATTERNING PROCESS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as optical lithography approaches its technological and economical limits, a directed self-assembly (DSA) process emerges as a potential candidate for patterning dense features. A DSA process takes advantage of the self-assembling properties of materials, such as block copolymers, to reach nanoscale dimensions while meeting the constraints of current manufacturing. Typical DSA processes require a guide pattern that "guides" the self-assembling process. The uniformity and precision of the guide pattern largely affect the quality of the self-assembled polymer features, as well as the final pattern density. Therefore, a guide pattern with precise critical dimension (CD) is desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7A-7H are perspective views of forming a semiconductor device according to the method of FIGS. 6A and 6B, in accordance with some embodiments.

DETAILED DESCRIPTION

Figure 1:
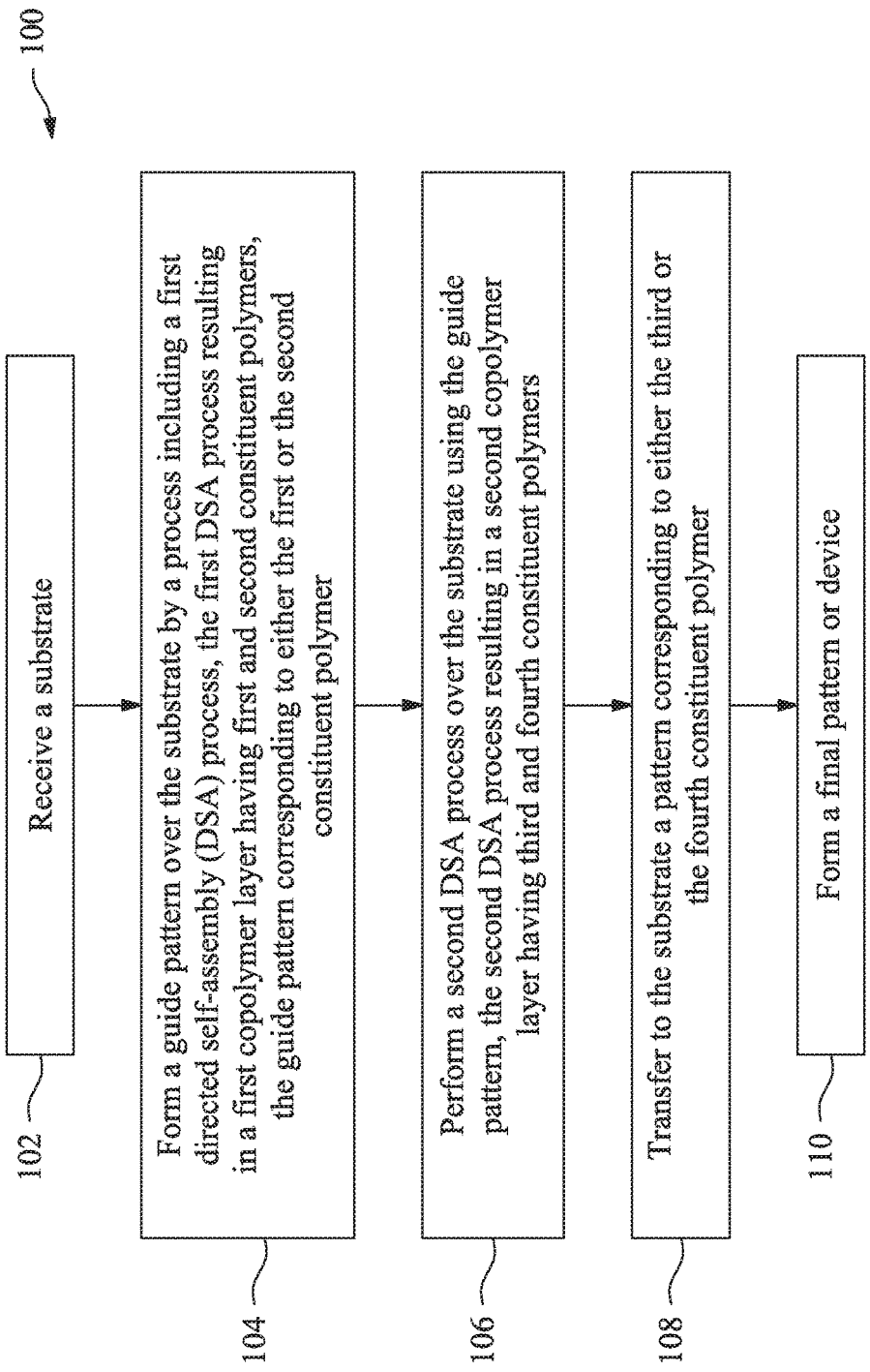
FIG. 1 shows a flow chart of a method of fabricating a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to methods for manufacturing semiconductor devices with dense and nanoscale patterns. When fabricating dense patterns, a DSA process may be used to enhance and augment the existing semiconductor manufacturing capabilities. In a typical DSA process, a block copolymer film is formed over lithographically defined surfaces and a microphase separation is induced to cause the constituent polymer molecules to self-assemble, thus creating densely packed features with highly uniform dimensions and shapes. Typically, a guide pattern is created by a lithography process and the guide pattern "guides" the above DSA process. The critical dimensions (CD) of the guide pattern directly impact the quality of the self-assembled features and the final pattern density. When a guide pattern is defined by a lithography process, its CD is inevitably limited by the underlying lithography process. In some approaches, a guide pattern is first defined by a lithography process, and is then trimmed to achieve a smaller CD. However, large etching bias in the trimming process may cause non-uniformity in the guide pattern and lead to defective final patterns. The present disclosure utilizes a multiple DSA (MDSA) patterning process to overcome the above issues. In an embodiment of the MDSA patterning process, a first DSA process is used to define and produce a guide pattern for a second DSA process. Since the guide pattern is defined and created by a DSA process, its CD can be precisely controlled. Advantageously, the final patterns produced by the second DSA process can have dense pitches and more uniformity in dimensions and shapes.

Referring now to FIG. 1, a flow chart of a method 100 of forming a semiconductor device is illustrated according to various aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is briefly described below. Then, some embodiments of the method 100 will be described in conjunction with FIGS. 2A-7H.

At operation 102, the method 100 (FIG. 1) receives a substrate. The substrate is a target where one or more patterns are to be formed thereon or therein. The substrate includes one or more layers of material or composition. In some embodiments, the substrate includes an elementary semiconductor (e.g., silicon or germanium) and/or a compound semiconductor (e.g., silicon germanium, silicon carbide, gallium arsenic, indium arsenide, gallium nitride, and indium phosphide). Other exemplary substrate materials include alloy semiconductors, such as silicon germanium carbide, gallium arsenic phosphide, and gallium indium phosphide. The substrate may also comprise non-semiconductor materials including soda-lime glass, fused silica, fused quartz, calcium fluoride ($CaF_2$), and/or other suitable materials. In some embodiments, the substrate has one or more layers defined within it, such as an epitaxial layer. For example, in one such embodiment, the substrate includes an epitaxial layer overlying a bulk semiconductor. Other layered substrates include semiconductor-on-insulator (SOI) substrates. In one such SOI substrate, the substrate includes a buried oxide (BOX) layer formed by a process such as separation by implanted oxygen (SIMOX). The substrate may include doped regions and have circuits formed thereon or therein.

At operation 104, the method 100 (FIG. 1) forms a guide pattern over the substrate. The guide pattern is formed by a process that includes a directed self-assembly (DSA) process (a first DSA process). The DSA process has the merit of forming dense patterns with finely controlled critical dimensions. Therefore, the guide pattern produced with the operation 104 is more precise than those produced with traditional lithographic methods. In an embodiment, the DSA process results in a copolymer layer over the substrate. The copolymer layer includes first and second constituent polymers, formed through a molecular self-assembling process, also known as microphase separation. Each of the constituent polymers may take a shape of sphere, cylinder, line, or other suitable shape. The shape and the dimension of the constituent polymer may depend on the property of the material used, the relative amounts of the constituent polymers, process variables including temperature, and other factors. Once a desired morphology is obtained, subsequent fabrication process may transfer the pattern from the copolymer layer to an underlayer to form a guide pattern. The guide pattern may correspond to either the first constituent polymer or the second constituent polymer. The individual constituent polymers may be removed thereafter, used as mask for patterning other layers, or used as part of the guide pattern.

At operation 106, the method 100 (FIG. 1) performs another DSA process (a second DSA process) over the substrate. The second DSA process uses the guide pattern produced above to further form densely packed patterns with fine pitches. The second DSA process results in another copolymer layer (a second copolymer layer) over the substrate. The second copolymer layer includes two constituent polymers: a third constituent polymer and a fourth constituent polymer. The guide pattern serves to position the third and/or the fourth constituent polymers over the substrate during the microphase separation. Because the guide pattern produced by the operation 104 is very precise, the location and dimension of the individual polymers produced by the operation 106 are also precise. This overcomes the non-uniformity and pattern defect issues associated with traditional methods.

At operation 108, the method 100 (FIG. 1) transfers to the substrate a pattern formed by the operation 106. The pattern may correspond to either the third constituent polymer or the fourth constituent polymer, depending on the fabrication process. The transferring of the pattern may include dry etching, wet etching, or other suitable methods.

At operation 110, the method 100 (FIG. 1) forms a final pattern or device in or on the substrate with the pattern defined by the operations 104 and 106. For example, the final pattern may be used for contact holes, interconnects, fins, or any suitable structures or features for a semiconductor device.

Further embodiments of the method 100 will be described below with reference to FIGS. 2A-7H.

Figure 2A:
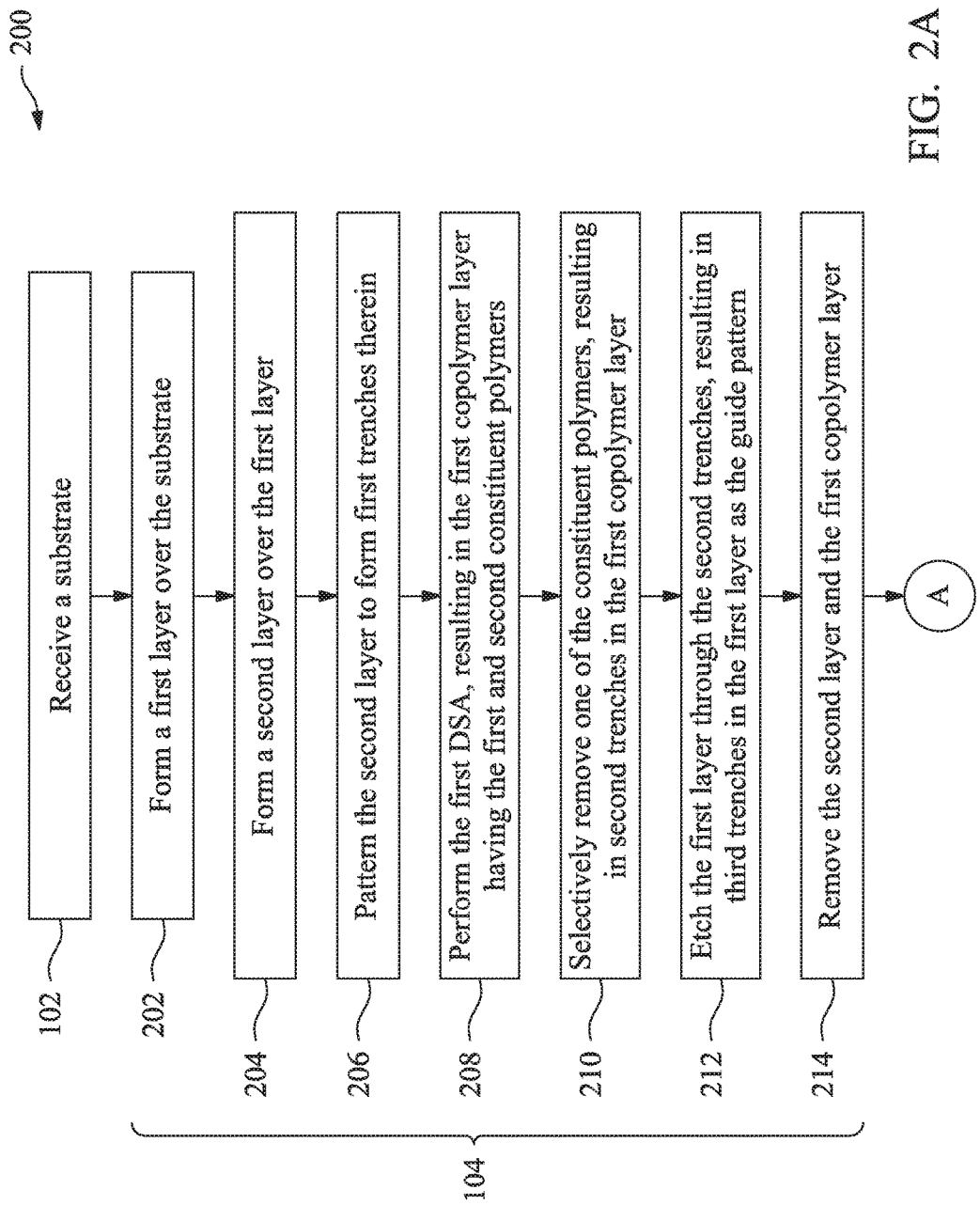
FIGS. 2A and 2B show a flow chart of a method of fabricating a semiconductor device, according to an embodiment of the method of FIG. 1.
Figure 2B:
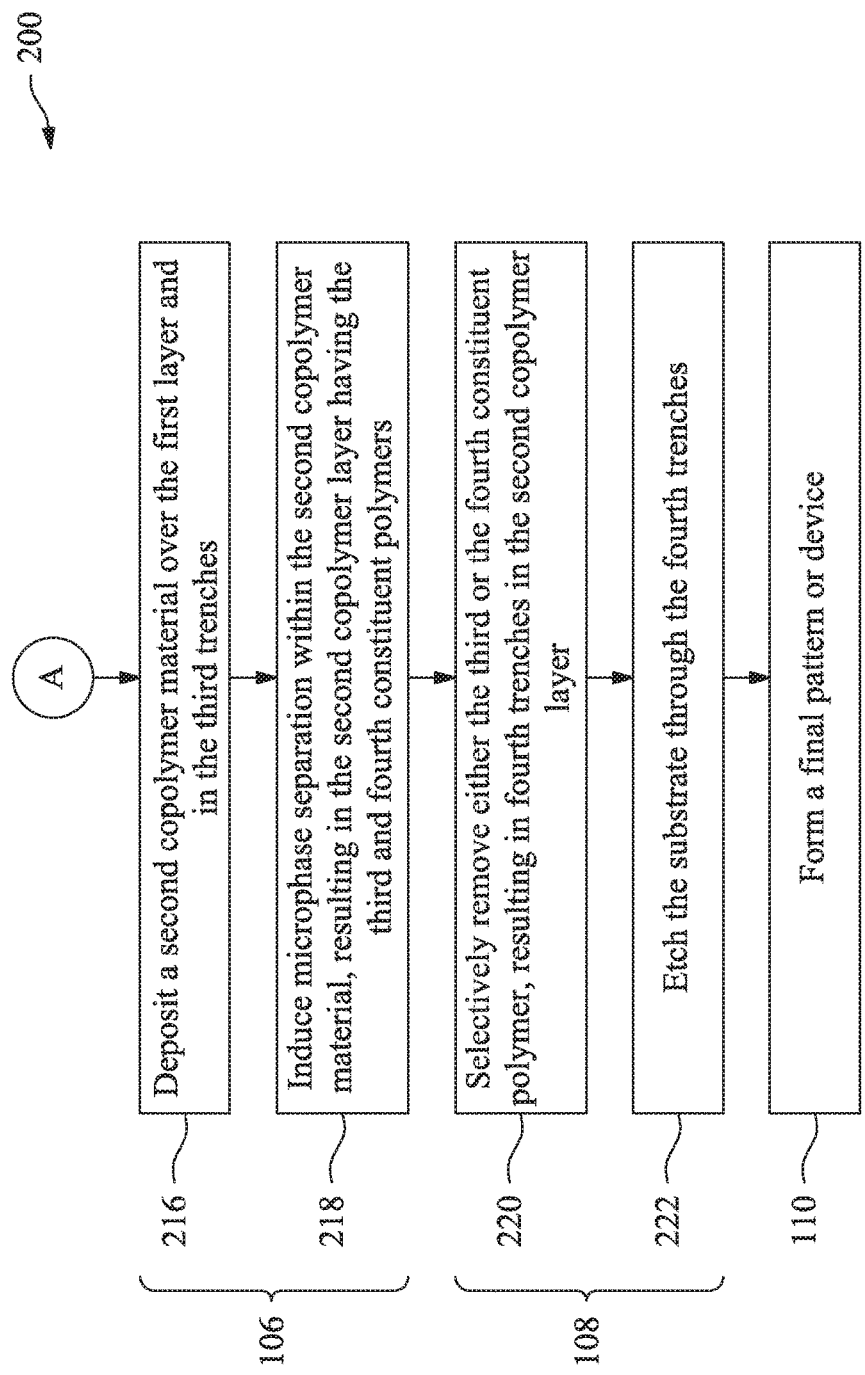

FIGS. 2A and 2B show a flow chart of a method 200 which is an embodiment of the method 100. FIGS. 3A-3M illustrate cross sectional view of a device 300 during various fabrication steps according to an embodiment of the method 200. The method 200 will be described below in conjunction with FIGS. 2A-3M.

Figure 3A:
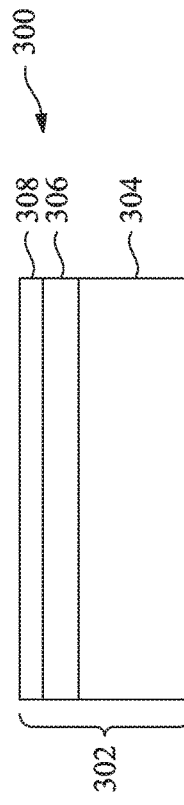
FIGS. 3A-3M are cross sectional views of forming a semiconductor device according to the method of FIGS. 2A and 2B, in accordance with some embodiments.

Referring to FIG. 2A, at operation 102, the method 200 receives a substrate 302 (FIG. 3A). The substrate 302 includes one or more material layers or compositions. In the embodiment as shown, the substrate 302 includes material layers 304, 306, and 308. In an embodiment, the layer 304 includes a semiconductor such as an elementary semiconductor, a compound semiconductor, or an alloy semiconductor. In an embodiment, the layer 306 is a hard mask layer. For example, it may include a dielectric material such as silicon oxide or silicon nitride. The layer 306 may be formed over the layer 304 through deposition or other methods. In an embodiment, the layer 308 is a bottom anti-reflective coating (BARC) layer, such as a silicon BARC layer or a nitrogen-free BARC layer.

Figure 3B:
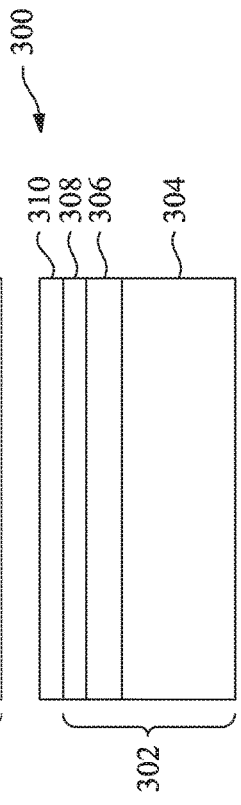

At operation 202, the method 200 (FIG. 2A) forms a first layer 310 over the substrate 302. Referring to FIG. 3B, the layer 310 may be formed by deposition, coating such as spin-on coating, or other processes. The layer 310 is a neutral layer for a subsequent DSA process in that it does not contribute to the microphase separation of the polymer materials used in the DSA process. Any material suitable for the layer 310 is contemplated by the present disclosure.

Figure 3C:
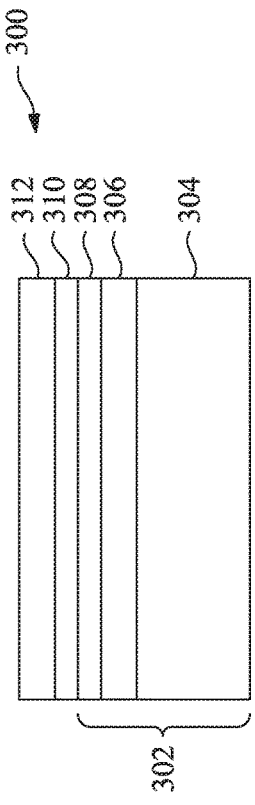

At operation 204, the method 200 (FIG. 2A) forms a second layer 312 over the layer 310. Referring to FIG. 3C, in the present embodiment, the layer 312 is a photoresist (or resist) layer. The resist layer 312 may be a positive resist or a negative resist, and may be a resist suitable for deep ultraviolet (DUV), extreme ultraviolet (EUV), electron beam (e-beam), or other lithography processes. The second layer 312 may be formed by a process including coating and soft baking.

Figure 3D:
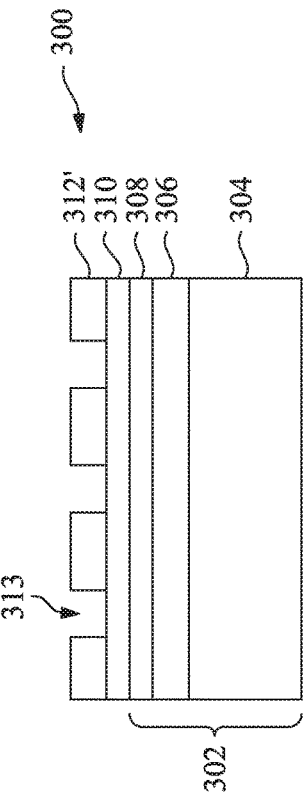

At operation 206, the method 200 (FIG. 2A) patterns the second layer 312 to form first trenches 313. Referring to FIG. 3D, in the present embodiment, the trenches 313 may be formed by exposing the resist layer 312 to an energy beam (with or without a mask), post-exposure baking, developing, and hard baking in one example. The operation 206 results in a patterned resist layer 312' (or resist pattern 312'). Portions of the neutral layer 310 are exposed through the trenches 313.

Figure 3E:
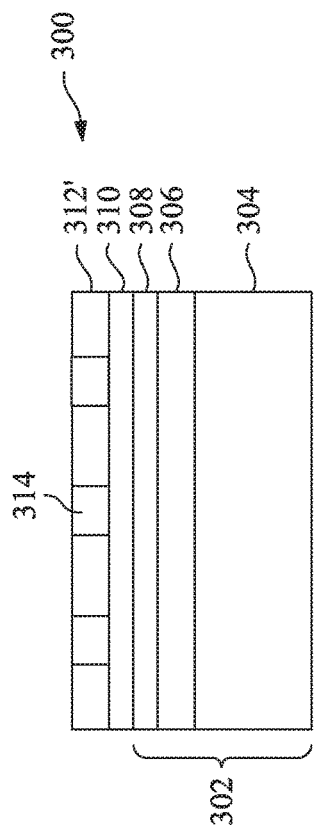

At operation 208, the method 200 (FIG. 2A) performs a DSA process (e.g. the first DSA process in the operation 104) over the substrate 302. This involves one or more processes. In the present embodiment, the method 200 first deposits in the trenches 313 a copolymer material 314 (FIG. 3E). In an embodiment, the copolymer material 314 includes polystyrene and polymethyl methacrylate (PMMA) and is deposited with a coating or spin-on coating process. Polystyrene is hydrophobic, whereas PMMA is slightly less so. Further embodiments may also utilize a copolymer material 314 with a hydrophobic first constituent and a hydrophilic second constituent as this facilitates segregation of the constituent polymers.

Figure 3F:
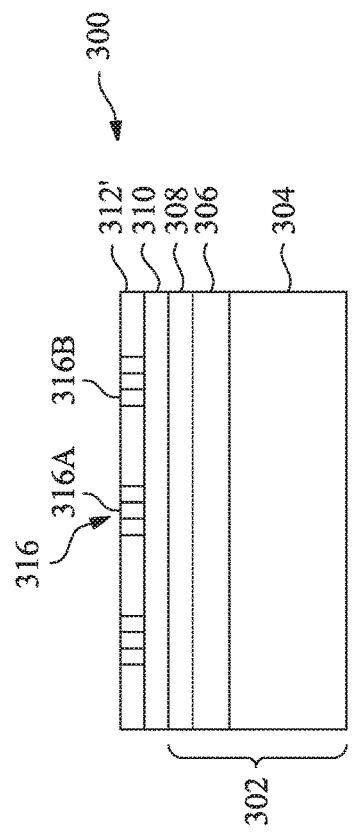

After the copolymer material layer 314 is deposited in the trenches 313, the method 200 performs one or more processes to induce microphase separation (or segregation) in the copolymer material 314. The resulting copolymer layer is labeled as the copolymer layer 316 (FIG. 3F). In the present embodiment, the copolymer layer 316 includes two constituent polymers, the first constituent polymer 316A and the second constituent polymer 316B (FIG. 3F). The dimension, shape, and configuration of the first and second constituent polymers depend on various factors, such as the material used, the relative amounts of the constituent polymers, process variables such as temperature, the material of the resist layer 312', among other factors. As stated above, the neutral layer 310 does not affect the segregation of the two constituent polymers in the present embodiment. However, in other embodiments, the layer 310 can be used to effectuate desirable results. For example, it may be used to create a vertical separation. In various embodiments, the inducing of the microphase separation may include heating, cooling, introduction of a solvent, application of a magnetic field, and/or other techniques. In an exemplary embodiment, the copolymer material 314 containing polystyrene and PMMA is annealed at a temperature of between about 200° C. and about 400° C. in order to induce microphase separation. This causes the constituent polymer blocks to segregate and align, thereby forming the constituent polymers 316A and 316B.

Figure 3G:
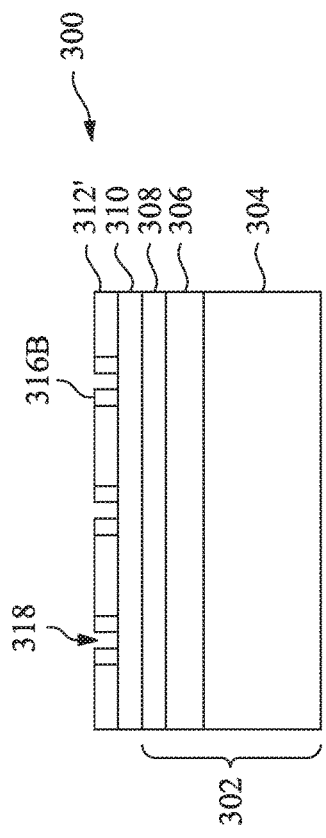

At operation 210, the method 200 (FIG. 2A) selectively removes one of the constituent polymers from the copolymer layer 316 to form trenches therein. Referring to FIG. 3G, in the present embodiment, the constituent polymer 316A is removed, thereby forming trenches 318 in the copolymer layer 316. The layer 310 is exposed through the trenches 318. In another embodiment, the constituent polymer 316B, instead of 316A, is removed. The removal process may include any suitable etching process such as dry etching, wet etching, ashing, and/or other etching methods (e.g., reactive ion etching). In some embodiments, the removal process includes the use of a solvent such as acetone, benzene, chloroform, methylene chloride, and/or other suitable solvent. In an exemplary embodiment, PMMA is more sensitive to $O_2$ plasma etching than polystyrene. Accordingly $O_2$ plasma etching is used with a PMMA/polystyrene copolymer coating 316 to remove the PMMA and leave the polystyrene behind as an etching mask.

Figure 3H:
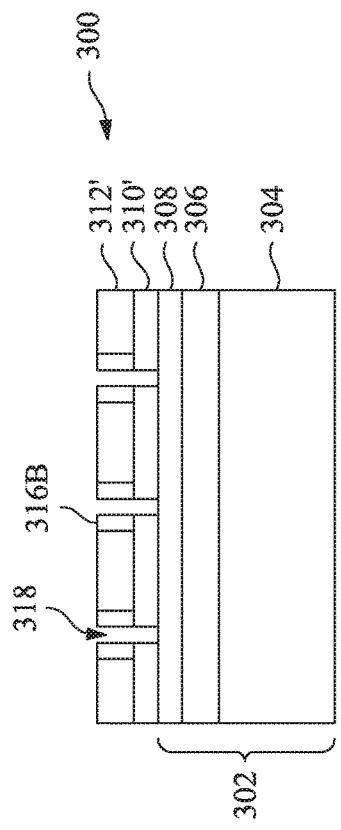

At operation 212, the method 200 (FIG. 2A) etches the layer 310 through the trenches 318. The constituent polymer 316B and the resist pattern 312' serve as an etching mask. The etching process results in a patterned layer 310' (FIG. 3H). The etching process may include any suitable etching techniques such as dry etching, wet etching, ashing, and/or other etching methods (e.g., reactive ion etching).

Figure 3I:
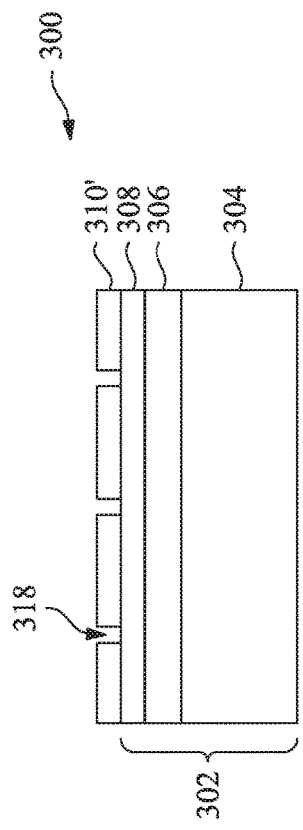

At operation 214, the method 200 (FIG. 2A) removes the resist pattern 312' and the copolymer layer 316 including the constituent polymer 316B, leaving the patterned layer 310' over the substrate (FIG. 3I). The removal process may include ashing, stripping, etching, and/or other suitable methods. Thereafter, the surfaces of the device 300 may be cleaned, making it ready for further fabrication such as the second DSA process 106. The trenches 318 in the patterned layer 310' serves as the guide pattern for the second DSA process. Since the trenches 318 are defined by the first DSA process (derived from the constituent polymer 316A in FIG. 3F), its shape and critical dimensions can be precisely controlled. This builds a robust foundation for the second DSA process.

Figure 3J:
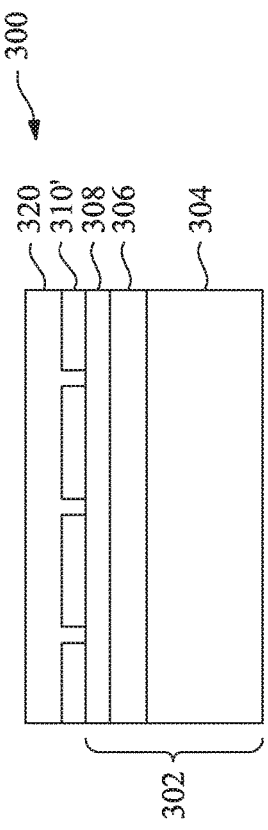

The method 200 proceeds to performing the second DSA process with the trenches 318 as the guide pattern. At operation 216, the method 200 (FIG. 2B) deposits another copolymer material layer 320 over the patterned layer 310' and in the trenches 318 (FIG. 3J). This process is similar to the process described above with reference to FIG. 3E. However, the copolymer material 320 may be the same as or different from the copolymer material 314. In various embodiments, the layer 320 is formed to have a suitable thickness to be used as an etching mask for subsequent etching processes.

Figure 3K:
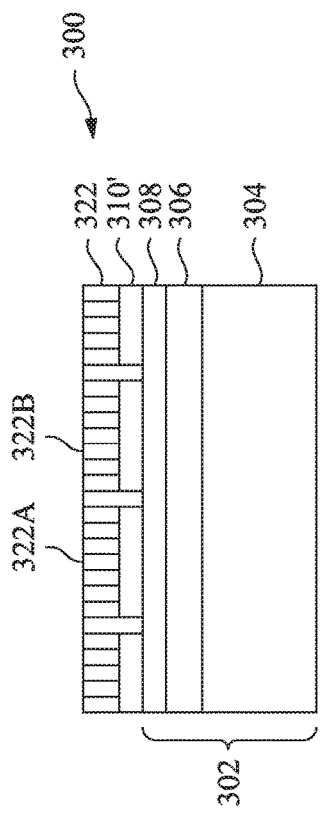

At operation 218, the method 200 (FIG. 2B) induces microphase separation in the copolymer material layer 320, resulting in a copolymer layer 322 (FIG. 3K). Referring to FIG. 3K, the copolymer layer 322 includes a first constituent polymer 322A and a second constituent polymer 322B. The process of inducing microphase separation is similar to the process described above with reference to FIG. 3F. However, this microphase separation process is guided by the trenches 318 (FIG. 3I). More particularly, in the embodiment shown in FIG. 3K, the trenches 318 define the positions and/or the critical dimensions of the constituent polymer 322A. This creates a robust and repeatable process for producing densely packed patterns 322A and 322B.

Figure 3L:
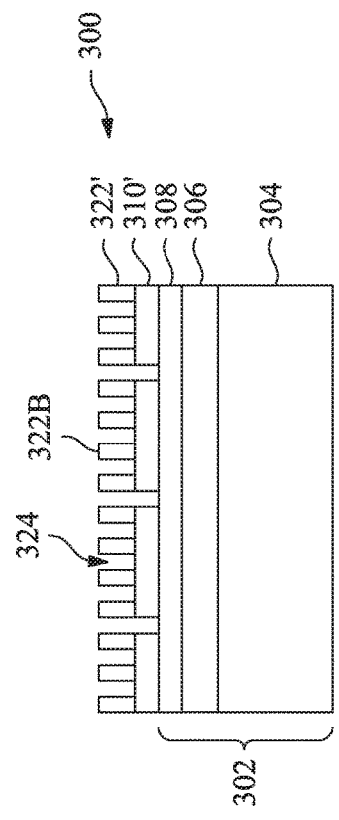

At operation 220, the method 200 (FIG. 2B) selectively removes one of the constituent polymers from the copolymer layer 322 to form trenches therein. Referring to FIG. 3L, in the illustrated embodiment, the constituent polymer 322A is removed from the device 300, thereby resulting in trenches 324 in the copolymer layer 322. The patterned copolymer layer is labeled as 322' for the sake of convenience. In another embodiment, the constituent polymer 322B, instead of 322A, may be removed. The removal process may include ashing, stripping, etching, and/or other suitable methods.

Figure 3M:
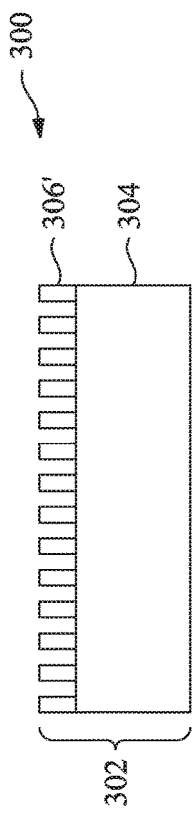

At operation 222, the method 200 (FIG. 2B) etches the substrate 302 through the trenches 324, thereby transferring the pattern from the patterned copolymer layer 322' to the substrate 302. Referring to FIG. 3M, one or more layers of the substrate 302 are etched through the trenches 324 and the patterned copolymer layer 322' is removed. In the illustrated embodiment, the layers 310' and 308 are also removed after the etching processes, leaving a patterned layer 306' over the material layer 304.

At operation 110, the method (FIG. 2B) performs further fabrication steps with the patterned substrate 302 in order to form a final pattern or device, as described with reference to FIG. 1.

Figure 4A:
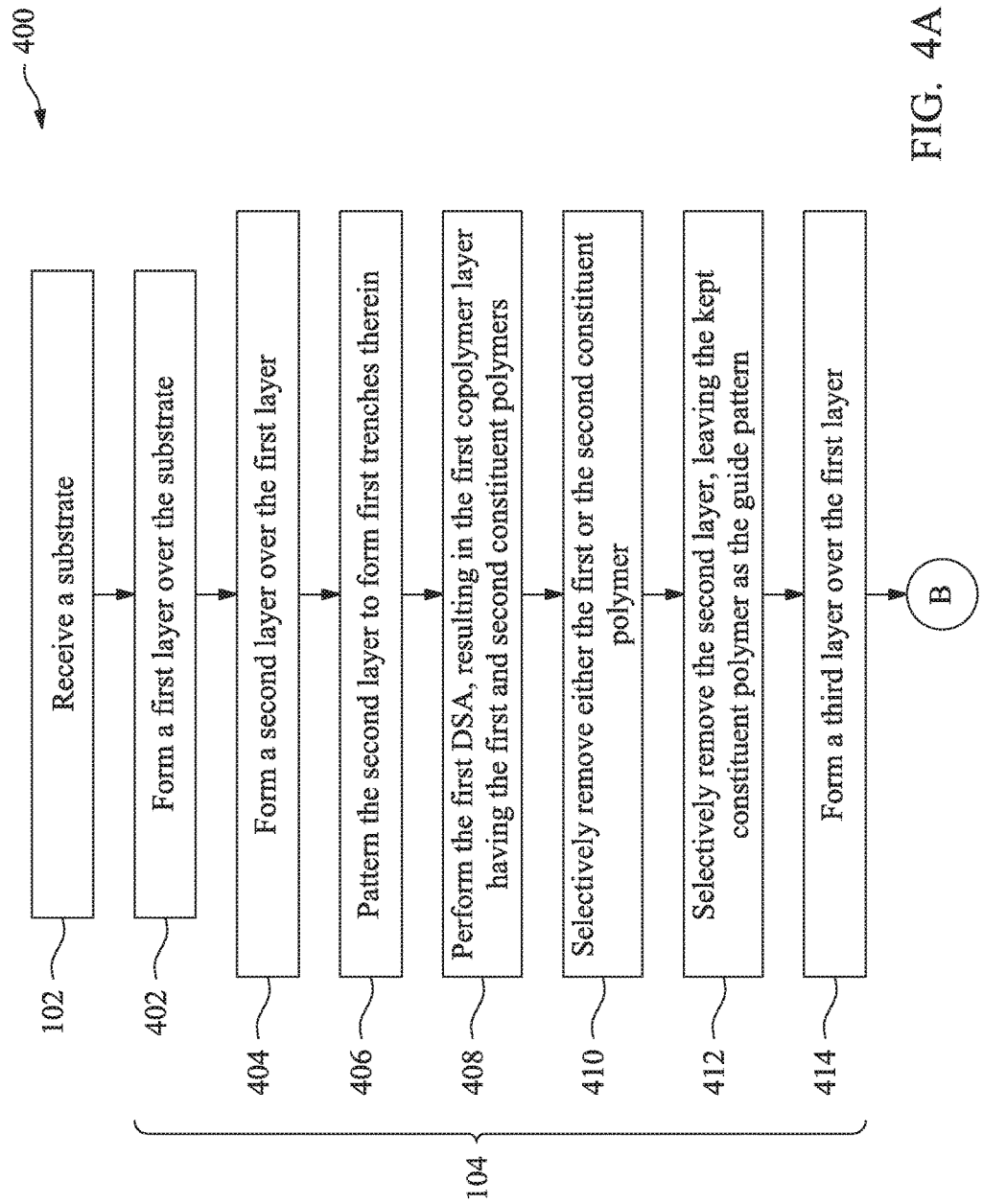
FIGS. 4A and 4B show a flow chart of a method of fabricating a semiconductor device, according to another embodiment of the method of FIG. 1.
Figure 4B:
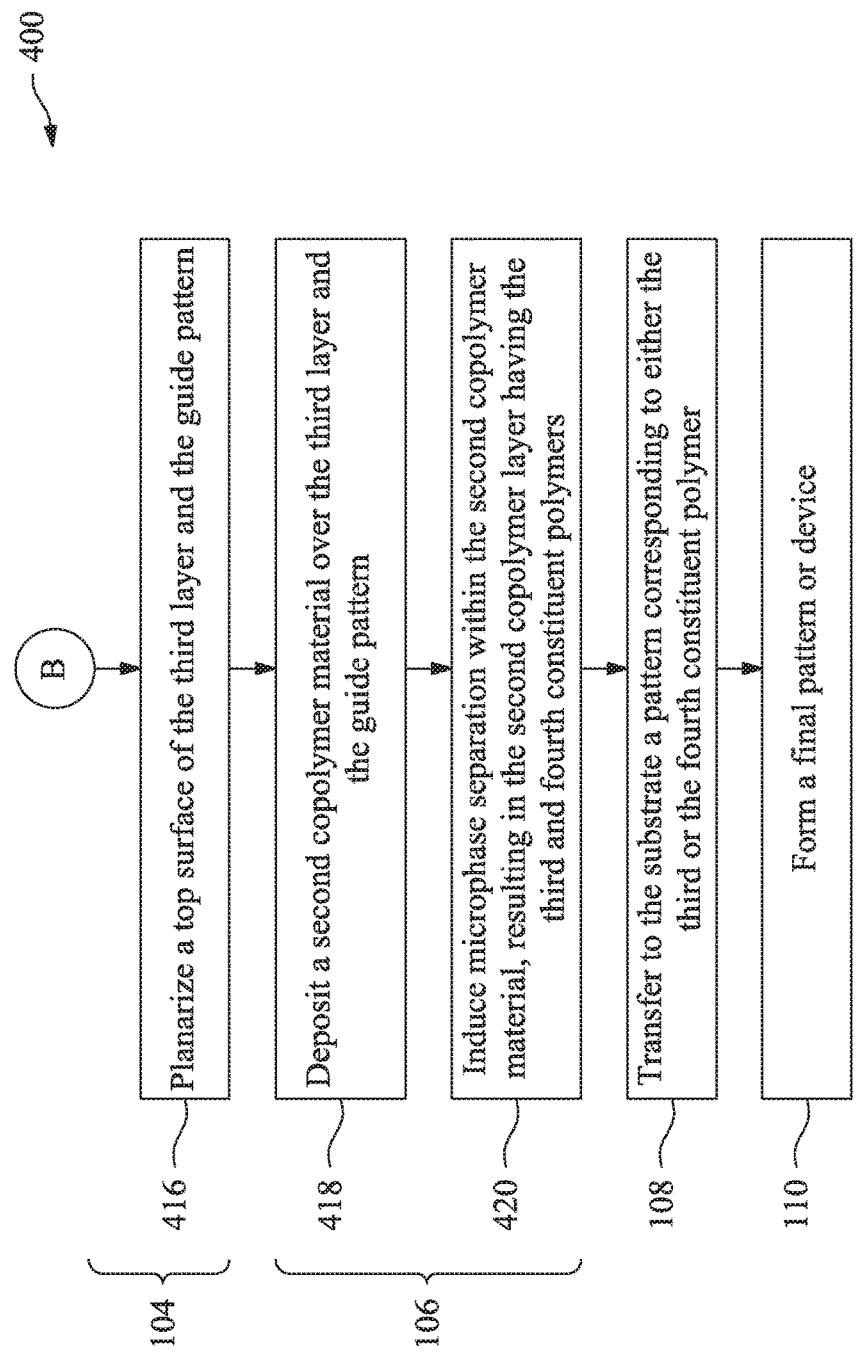

FIGS. 4A and 4B show a flow chart of a method 400 which is another embodiment of the method 100. FIGS. 5A-5J illustrate cross sectional views of a device 500 during various fabrication steps according to an embodiment of the method 400. The method 400 will be described below in conjunction with FIGS. 4A-5J. Some of the operations are similar to those shown in FIGS. 2A and 2B, and will be abbreviated or omitted for the sake of simplicity.

Figure 5A:
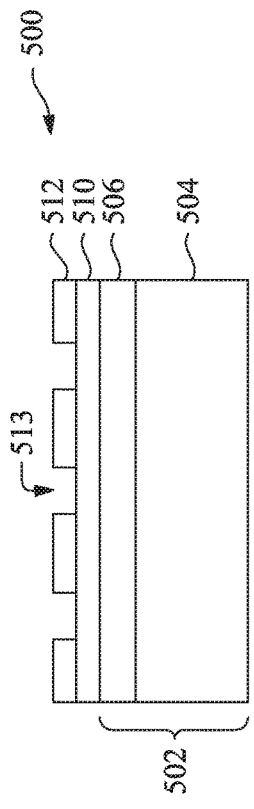
FIGS. 5A-5J are cross sectional views of forming a semiconductor device according to the method of FIGS. 4A and 4B, in accordance with some embodiments.
Figure 5B:
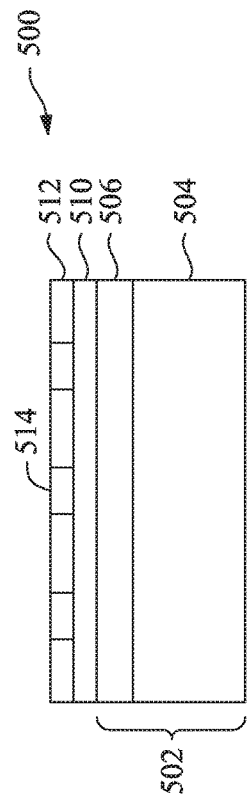

At operation 102, the method 400 (FIG. 4A) receives a substrate 502. Referring to FIG. 5A, the substrate 502 includes material layers 504 and 506, which may be similar to the material layers 304 and 306 respectively.

At operation 402, the method 400 (FIG. 4A) forms a first layer 510 over the substrate 502. At operation 404, the method 400 (FIG. 4A) forms a second layer 512 over the first layer 510. At operation 406, the method 400 (FIG. 4A) patterns the second layer 512 to form trenches 513 therein (FIG. 5A). The operations 402, 404, and 406 are similar to the operations 202, 204, and 206 respectively.

Figure 5C:
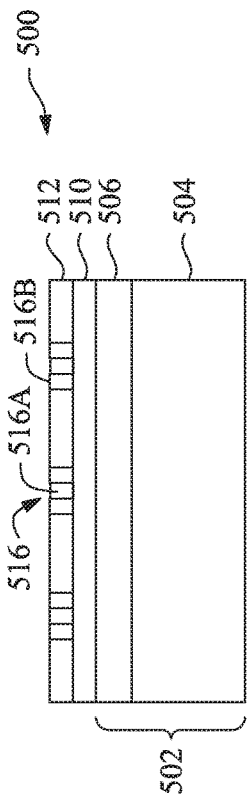

At operation 408, the method 400 (FIG. 4A) performs a first DSA process over the substrate 502 and in the trenches 513. In an embodiment, this includes depositing a copolymer material 514 in the trenches 513 (FIG. 5B) and inducing microphase separation in the copolymer material 514 to form a copolymer layer 516 having constituent polymers 516A and 516B (FIG. 5C). The operation 408 is similar to the operation 208 discussed above.

Figure 5D:
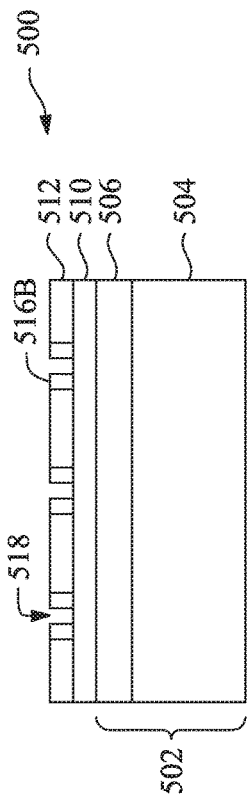

At operation 410, the method 400 (FIG. 4A) selectively removes one of the constituent polymers from the copolymer layer 516 to form trenches therein. Referring to FIG. 5D, in the illustrate embodiment, the constituent polymer 516A is removed, exposing the layer 510 underneath. The removal process may include ashing, stripping, etching, and/or other suitable methods. In another embodiment, the constituent polymer 516B, instead of the constituent polymer 516A, may be removed depending on the fabrication process. This operation is similar to the operation 210.

Figure 5E:
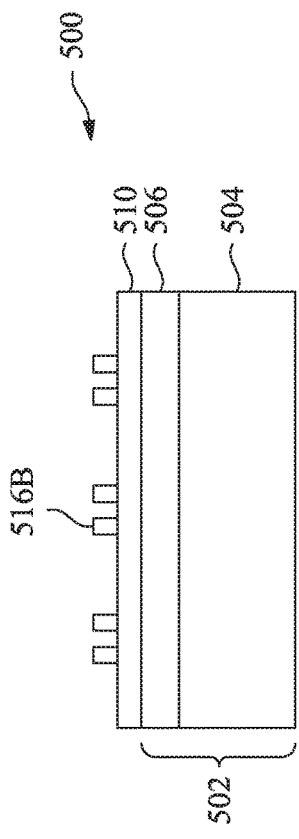

At operation 412, the method 400 (FIG. 4A) selectively removes the patterned second layer 512 while keeping the constituent polymer 516B. The removal process may include ashing, stripping, etching, and/or other suitable methods. Operation 412 results in the constituent polymer 516B over the first layer 510 (FIG. 5E). The constituent polymer 516B will be used as the guide pattern for a subsequent DSA process. Therefore, it is also referred to as the guide pattern 516B.

Figure 5F:
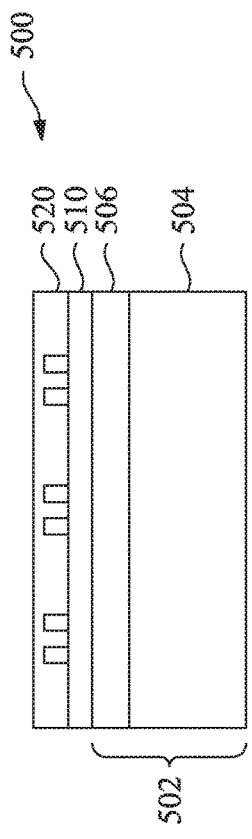

At operation 414, the method 400 (FIG. 4A) forms a third layer 520 over the first layer 510. Referring to FIG. 5F, the third layer 520 is deposited over the first layer 510 and the constituent polymer 516B. In an embodiment, the material of the third layer 520 is the same as that of the first layer 510. In another embodiment, the material of the third layer 520 is different from that of the first layer 510. In embodiments, the third layer 520 uses a material neutral for the subsequent DSA process to be performed thereon. The third layer 520 may be formed by coating, depositing, or other suitable methods.

Figure 5G:
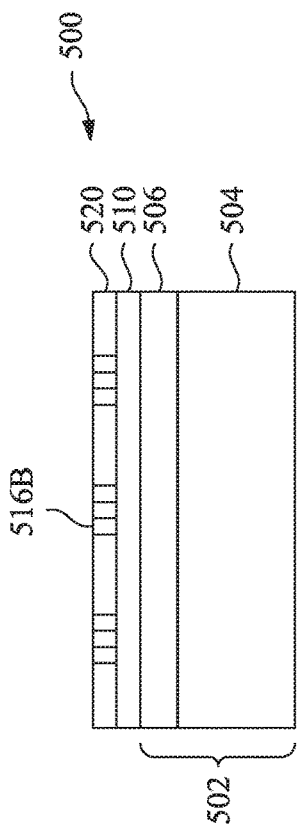

At operation 416, the method 400 (FIG. 4B) planarizes a top surface of the device 500, thereby exposing the guide pattern 516B through the third layer 520. Referring to FIG. 5G, portions of the third layer 520 are removed by the planarization process and a top surface of the guide pattern 516B is exposed. Portions of the guide pattern 516B may also be removed during the process. The planarization process may include etching back, chemical mechanical planarization (CMP), cleaning, and/or other suitable methods.

Figure 5H:
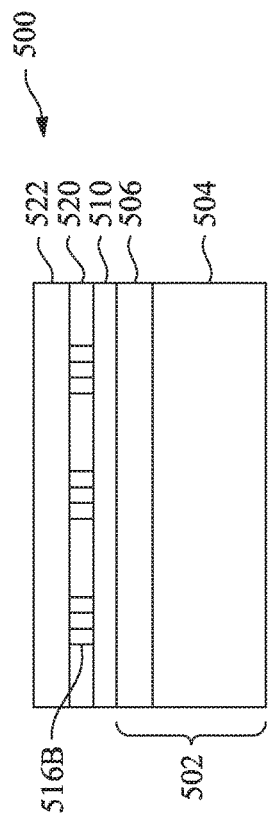
Figure 5I:
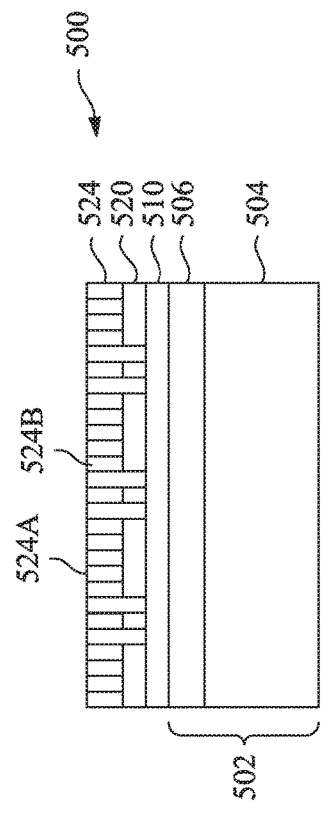

At operation 418, the method 400 (FIG. 4B) deposit a copolymer material layer 522 over the third layer 520 and the guide pattern 516B (FIG. 5H). This operation is similar to the operation 216.

At operation 420, the method 400 (FIG. 4B) induces microphase separation in the copolymer material layer 522, resulting in a copolymer layer 524. The copolymer layer 524 includes constituent polymers 524A and 524B. This operation is similar to the operation 218. However, instead of using trenches as the guide pattern as is the case in the operation 218 and FIG. 3K, this operation uses one of the constituent polymers (e.g., the constituent polymer 516B in FIG. 5I) from the preceding DSA process as the guide pattern. Similar performance in pattern formation is achieved. In the illustrated embodiment, the guide pattern 516B is substantially aligned with the first constituent polymer 524A. In another embodiment, the guide pattern 516B is substantially aligned with the second constituent polymer 524B.

Figure 5J:
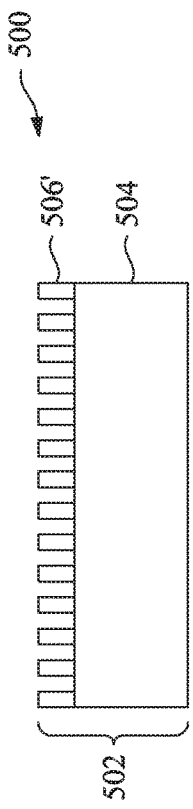

At operation 108, the method 400 (FIG. 4B) transfers to the substrate 502 a pattern that corresponds to either the constituent polymer 524A or the constituent polymer 524B. Referring to FIG. 5J, in the illustrated embodiment, a pattern is transferred to the material layer 506, resulting in a patterned material layer 506'. This may include dry etching, wet etching, or other suitable methods. The layers 524, 520, and 510 are removed after the various etching processes.

At operation 110, the method 400 (FIG. 4B) forms a final pattern or device with the patterned substrate 502 as described above.

Figure 6A:
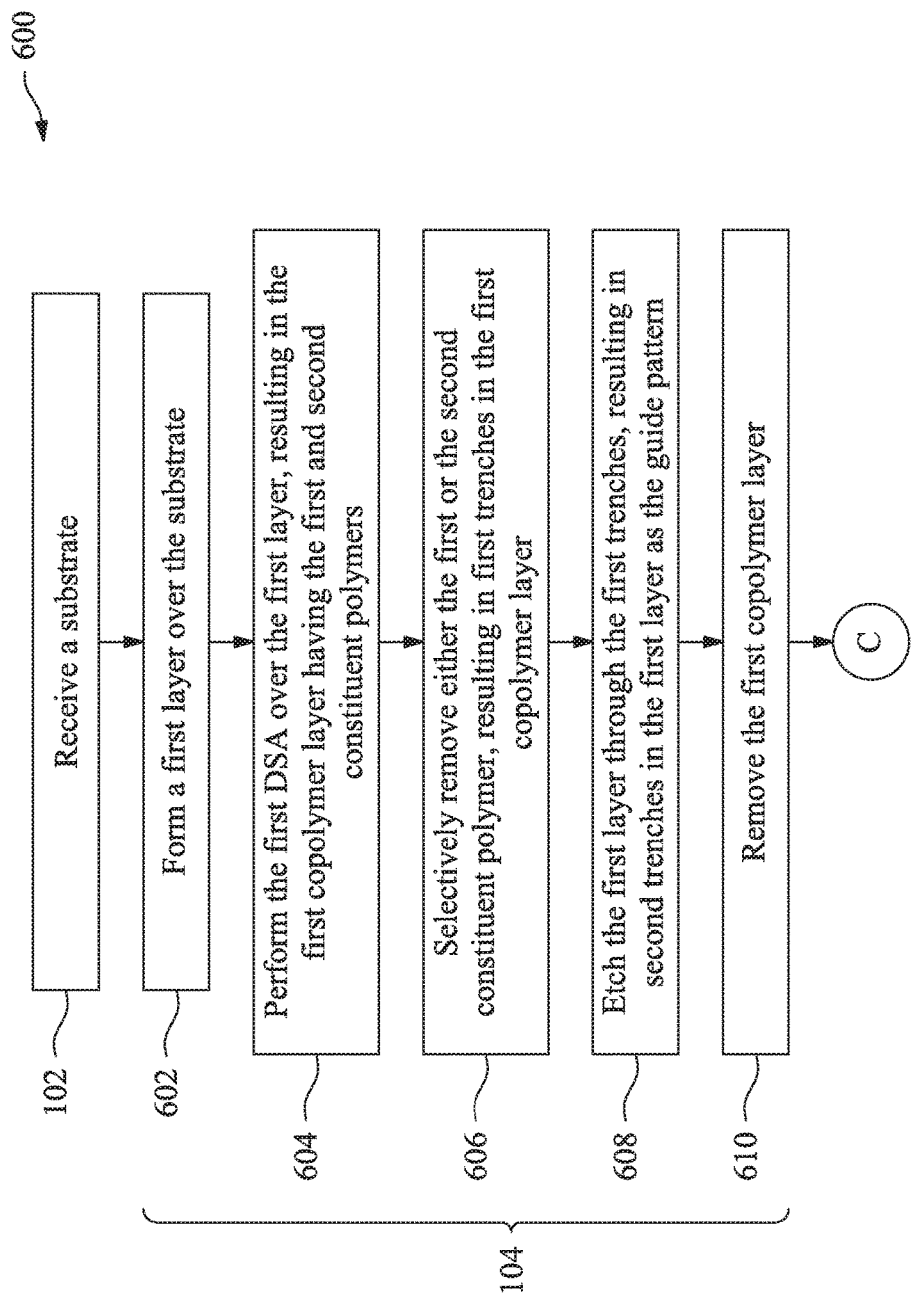
FIGS. 6A and 6B show a flow chart of a method of fabricating a semiconductor device, according to an embodiment of the method of FIG. 1.
Figure 6B:
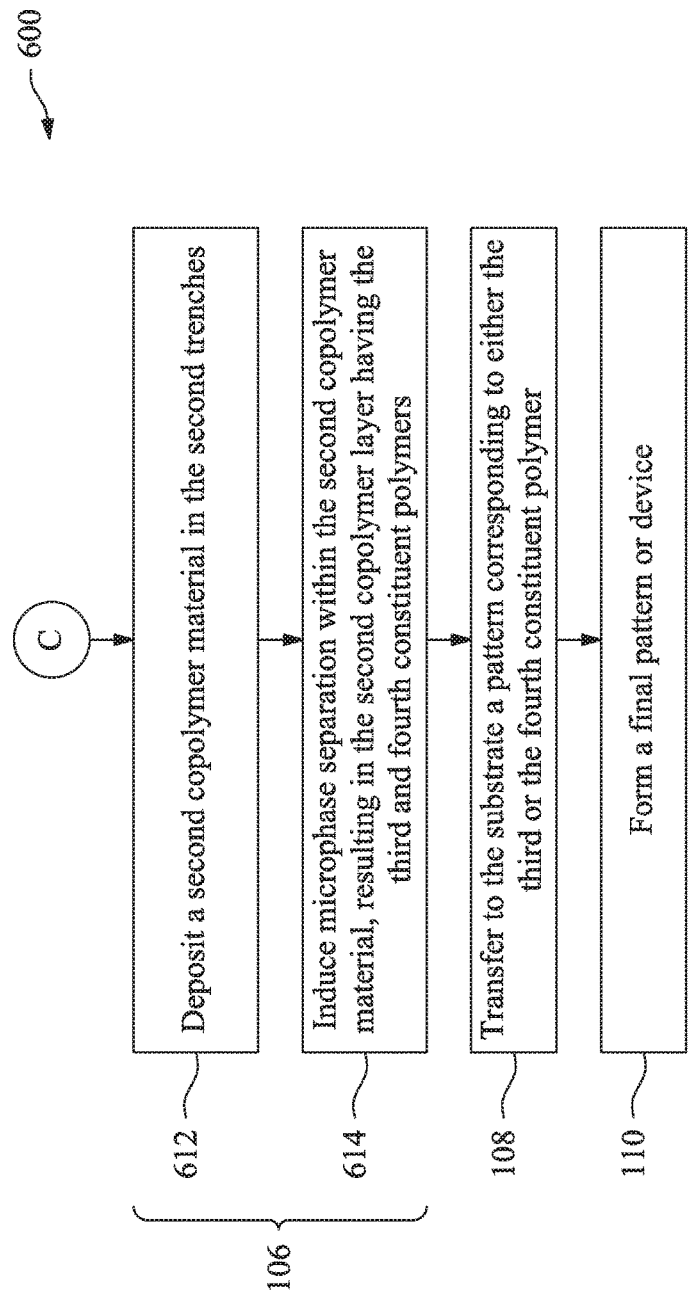

FIGS. 6A and 6B show a flow chart of a method 600 which is yet another embodiment of the method 100. FIGS. 7A-7H illustrate perspective views of a device 700 during various fabrication steps according to an embodiment of the method 600. The method 600 will be described below in conjunction with FIGS. 6A-7H. Some of the operations are similar to those shown in FIGS. 2A, 2B, 4A and 4B, and will be abbreviated or omitted for the sake of simplicity.

Figure 7A:
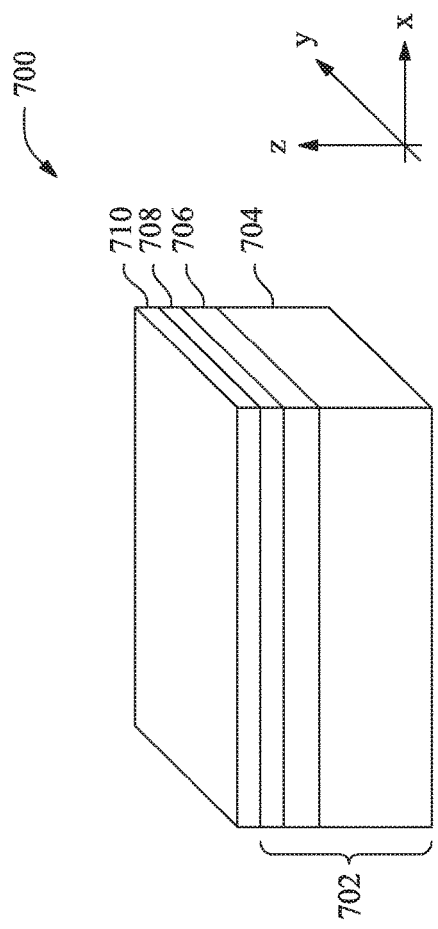

At operation 102, the method 600 (FIG. 6A) receives a substrate 702. Referring to FIG. 7A, the substrate 702 includes material layers 704, 706, and 708. In embodiments, the layers 704, 706, and 708 may be similar in material to the layers 304, 306, and 308 respectively.

At operation 602, the method 600 (FIG. 6A) forms a first layer 710 over the substrate 702 (FIG. 7A). In embodiments, the first layer 710 is a neutral layer for a subsequent DSA process to be performed thereon.

Figure 7B:
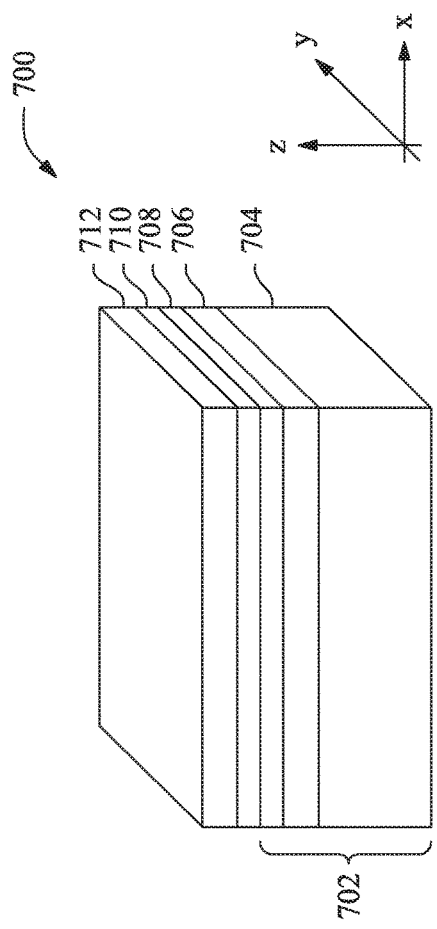
Figure 7C:
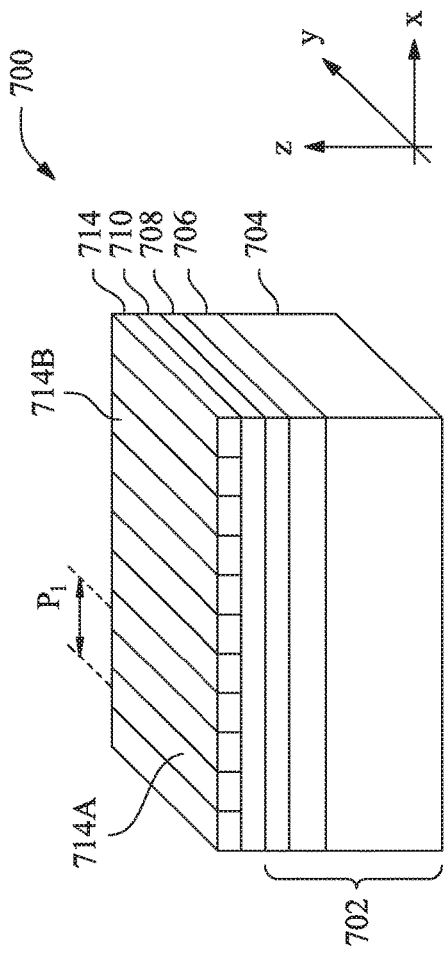

At operation 604, the method 600 (FIG. 6A) performs a first DSA process over the layer 710. This includes depositing a copolymer material 712 over the layer 710 (FIG. 7B) and inducing microphase separation in the copolymer material 712 to form a copolymer layer 714 having constituent polymers 714A and 714B (FIG. 7C). The operation 604 is similar to the operation 208 discussed above. In the embodiment illustrated in FIG. 7C, the constituent polymers 714A and 714B are line patterns that are oriented along the "y" direction and arranged in an alternating manner in the "x" direction. A pitch $P_1$ of the line patterns, defined as a distance from the center line of a pattern to the center line of an adjacent pattern along the "x" direction, equals to the sum of the dimension of the two constituent polymers 714A and 714B in the "x" direction. In another embodiment, the pitch $P_1$ can also be defined as a distance from the edge of a pattern to the edge of an adjacent pattern along the "x" direction. The pitch $P_1$ can be well controlled during the DSA process.

Figure 7D:
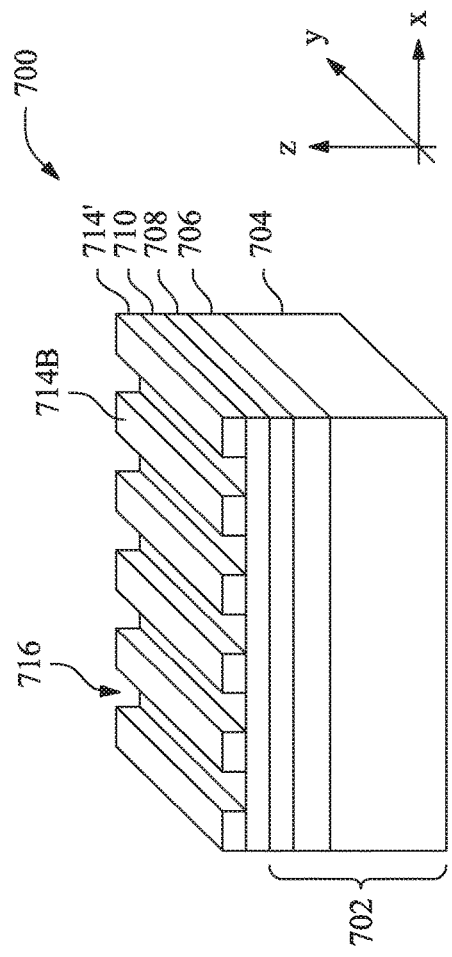

At operation 606, the method 600 (FIG. 6A) selectively removes one of the constituent polymers from the copolymer layer 714, resulting in a patterned copolymer layer 714'. Referring to FIG. 7D, in the illustrated embodiment, the constituent polymer 714A is removed thereby forming trenches 716 in the patterned copolymer layer 714'. The removal process may include ashing, stripping, etching, and/or other suitable methods. In another embodiment, the constituent polymer 714B, instead of the constituent polymer 714A, may be removed depending on the fabrication process. This operation is similar to operation 210.

Figure 7E:
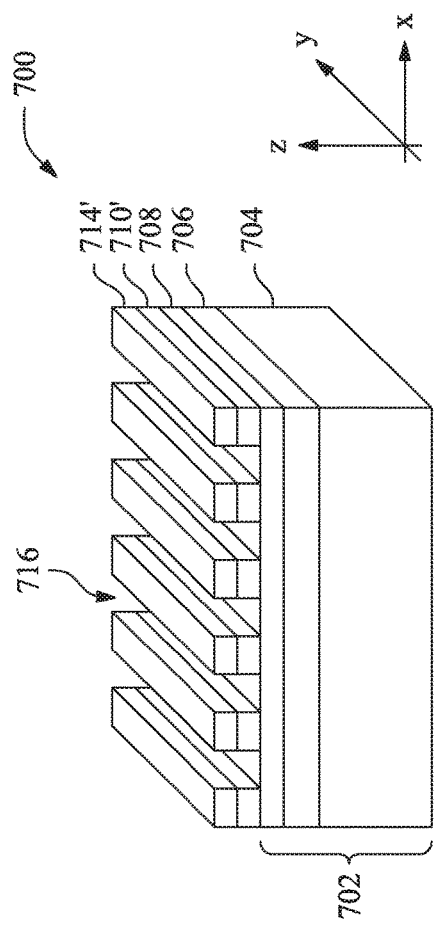

At operation 608, the method 600 (FIG. 6A) etches the first layer 710 through the trenches 716 thereby forming a patterned first layer 710'. Referring to FIG. 7E, the etching process extends the trenches 716 through the layer 710 and exposes the material layer 708. The etching process may include any suitable etching techniques such as dry etching, wet etching, ashing, and/or other etching methods (e.g., reactive ion etching). The patterned copolymer layer 714' is used as an etch mask during the etching processes.

Figure 7F:
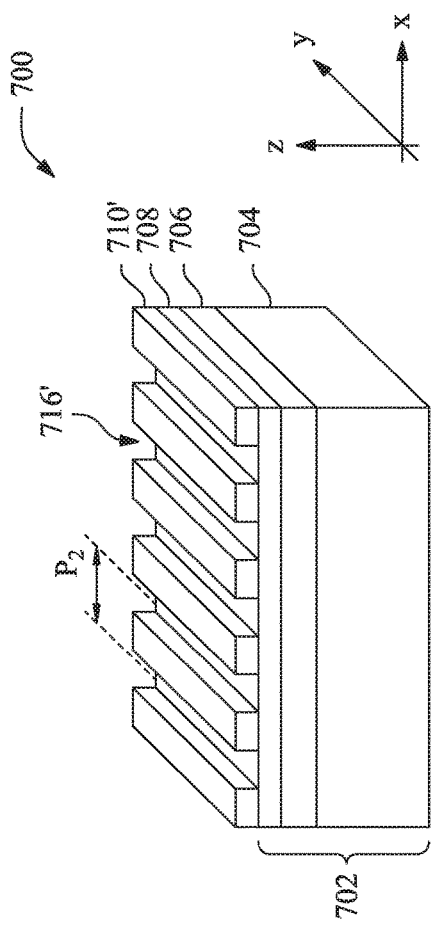

At operation 610, the method 600 (FIG. 6A) removes the patterned copolymer layer 714'. Referring to FIG. 7F, trenches 716' are formed in the patterned layer 710' and will be used as the guide pattern for a subsequent DSA process. A pitch $P_2$ of the trenches 716' is substantially the same as the pitch $P_1$ in FIG. 7C, taking into account of the etching biases in the various etching processes. The removal process may include ashing, stripping, etching, and/or other suitable methods. One or more cleaning process may be performed to clean the surfaces of the device 700.

At operation 612, the method 600 (FIG. 6B) deposits a copolymer material 718 in the trenches 716'. Referring to FIG. 7G, the copolymer material 718 fills the trenches along the "y" direction. In embodiments, the copolymer material 718 is different from the copolymer material 712 (FIG. 7B). In embodiments, both the material layer 708 and the patterned layer 710' are neutral to the individual constituent polymers in the copolymer material 718. The copolymer material 718 may be deposited using coating or other suitable methods as discussed above.

At operation 614, the method 600 (FIG. 6B) induces microphase separation in the copolymer material 718. Referring to FIG. 7H, the microphase separation converts the copolymer material 718 to a copolymer layer 720 having constituent polymers 720A and 720B. In the illustrated embodiment, the constituent polymers 720A and 720B segregate along the "y" direction. Further, the constituent polymers 720A take a cylindrical shape (e.g. to be used as a hole pattern). In the embodiment shown, a pitch, $P_3$, of the constituent polymers 720A is defined as a distance from the center line of one cylinder to the center line of an adjacent cylinder along the "y" direction. The pitch $P_3$ is determined by the copolymer material 718. The configuration of the patterns corresponding to the constituent polymer 720A is determined by both the first DSA process (operation 604) and the second DSA process (operations 612 and 614). The first DSA process defines the patterns' pitch along the "x" direction (pitch $P_2$) and the second DSA process defines the patterns' pitch along the "y" direction (pitch $P_3$). Since the critical dimensions of the constituent polymers in both the first and second DSA processes can be precisely controlled, a final pattern (e.g., a hole pattern corresponding to the constituent polymer 720A) can be created with precision and desirable density.

At operation 108, the method 600 (FIG. 6B) transfers a pattern to the substrate 702, wherein the pattern corresponds to one of the constituent polymers 720A and 720B. For example, operation 108 may transfer the pattern corresponding to the constituent polymer 720A. This may include selectively removing the constituent polymer 720A from the copolymer layer 720 thereby forming trenches therein; etching the substrate 702 through the trenches; and thereafter removing the patterned copolymer layer 720. Various other methods may be used.

At operation 110, the method 600 (FIG. 6B) forms a final pattern or device with the substrate 702 patterned above. For example, the final pattern may be contacts, interconnects, fins, or any suitable structures or features for a semiconductor device.

Although not intended to be limiting, one or more embodiments of the present disclosure provide many benefits to a semiconductor device and the formation thereof. For example, embodiments of the present disclosure provide methods for forming densely packed patterns with uniformity and precision by performing multiple DSA processes. In embodiments, one DSA process is used to produce a guide pattern for a subsequent DSA process. The precision of such guide patterns exceeds that with traditional photolithographic methods. Furthermore, embodiments of the present disclosure can be easily integrated into existing fabrication flow. In addition, even though two DSA processes are illustrated above, embodiments of the present disclosure may include more than two DSA processes where one builds upon another accumulatively.

In one exemplary aspect, the present disclosure is directed to a method of forming a target pattern for a semiconductor device. The method includes receiving a substrate and forming a guide pattern over the substrate by performing a process that includes a first directed self-assembly (DSA) process. The first DSA process results in a first copolymer layer over the substrate. The first copolymer layer includes a first constituent polymer and a second constituent polymer. The guide pattern corresponds to the first constituent polymer. The method further includes performing a second DSA process over the substrate using the guide pattern.

In another exemplary aspect, the present disclosure is directed to a method of patterning a substrate. The method includes forming a first layer over the substrate; forming a second layer over the first layer; and patterning the second layer thereby forming first trenches in the second layer. The method further includes forming a first copolymer layer in the first trenches by a first DSA process, wherein the first copolymer layer includes a first constituent polymer and a second constituent polymer. The method further includes forming a first pattern over the substrate corresponding to the first constituent polymer, and performing a second DSA process over the substrate using the first pattern as a guide pattern for the second DSA process.

In another exemplary aspect, the present disclosure is directed to a method of patterning a substrate. The method includes forming a first layer over the substrate, and forming a first copolymer layer over the first layer by a first DSA process, wherein the first copolymer layer includes a first constituent polymer and a second constituent polymer. The method further includes selectively removing the first constituent polymer from the first copolymer layer, resulting in first trenches in the first copolymer layer. The method further includes etching the first layer through the first trenches thereby forming second trenches in the first layer. The method further includes forming a second copolymer layer in the second trenches by a second DSA process, wherein the second copolymer layer includes a third constituent polymer and a fourth constituent polymer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a target pattern for a semiconductor device, comprising:

receiving a substrate;
forming a guide pattern over the substrate by performing a process that includes a first directed self-assembly (DSA) process, wherein the first DSA process results in a first copolymer layer over the substrate, the first copolymer layer includes a first constituent polymer and a second constituent polymer, and the guide pattern corresponds to the first constituent polymer; and
performing a second DSA process over the substrate using the guide pattern.

2. The method of claim 1, wherein the forming of the guide pattern includes:
forming a first layer over the substrate;
forming a second layer over the first layer;
patterning the second layer thereby forming first trenches in the second layer; and
forming the first copolymer layer in the first trenches by the first DSA process.

3. The method of claim 2, wherein the first DSA process includes:
depositing a first copolymer material in the first trenches, wherein the first copolymer material is directed self-assembling; and
inducing microphase separation within the first copolymer material thereby defining the first constituent polymer and the second constituent polymer.

4. The method of claim 2, wherein the forming of the guide pattern further includes:
selectively removing the first constituent polymer from the first copolymer layer, resulting in second trenches in the first copolymer layer;
etching the first layer through the second trenches thereby forming third trenches in the first layer as the guide pattern; and
thereafter removing the second layer and the first copolymer layer.

5. The method of claim 4, wherein the performing of the second DSA process includes:
forming a second copolymer layer over the first layer and in the third trenches, wherein the second copolymer layer includes a third constituent polymer and a fourth constituent polymer.

6. The method of claim 5, further comprising:
transferring to the substrate a pattern corresponding to the third constituent polymer.

7. The method of claim 2, wherein the forming of the guide pattern further includes:
selectively removing the second constituent polymer from the first copolymer layer;
selectively removing the second layer while leaving the first constituent polymer over the first layer as the guide pattern;
depositing a third layer over the first layer; and
planarizing a top surface of the third layer and the guide pattern.

8. The method of claim 7, wherein the performing of the second DSA process includes:
depositing a second copolymer material over the third layer and the guide pattern, wherein the second copolymer material is directed self-assembling; and
inducing microphase separation within the second copolymer material thereby defining a third constituent polymer and a fourth constituent polymer.

9. The method of claim 8, wherein the guide pattern is substantially aligned with one of: the third constituent polymer and the fourth constituent polymer.

10. The method of claim 1, wherein the forming of the guide pattern includes:
forming a first layer over the substrate;
forming the first copolymer layer over the first layer by the first DSA process;
selectively removing the first constituent polymer from the first copolymer layer, resulting in first trenches in the first copolymer layer;
etching the first layer through the first trenches thereby forming second trenches in the first layer as the guide pattern; and
thereafter removing the first copolymer layer.

11. The method of claim 10, wherein the performing of the second DSA process includes:
depositing a second copolymer material in the second trenches, wherein the second copolymer material is directed self-assembling; and
inducing microphase separation within the second copolymer material thereby defining a third constituent polymer and a fourth constituent polymer.

12. A method of patterning a substrate, comprising:
forming a first layer over the substrate;
forming a second layer over the first layer;
patterning the second layer thereby forming first trenches in the second layer;
forming a first copolymer layer in the first trenches by a first DSA process, wherein the first copolymer layer includes a first constituent polymer and a second constituent polymer;
selectively removing the second constituent polymer from the first copolymer layer;
selectively removing the second layer thereby leaving the first constituent polymer over the first layer;
depositing a third layer over the first layer and the first constituent polymer;
planarizing the third layer to expose the first constituent polymer; and
performing a second DSA process over the third layer and the first constituent polymer using the first constituent polymer as a guide pattern for the second DSA process.

13. The method of claim 12, wherein the planarizing the third layer to expose the first constituent polymer includes planarizing the third layer by a chemical mechanical planarization (CMP) process.

14. The method of claim 12, wherein the performing of the second DSA process includes:
forming a second copolymer layer over the third layer and the first constituent polymer, wherein the second copolymer layer includes a third constituent polymer and a fourth constituent polymer, and wherein the first constituent polymer is aligned with the third constituent polymer.

15. The method of claim 12, wherein the performing of the second DSA process includes:
forming a second copolymer layer over the third layer and the first constituent polymer; and
inducing microphase separation within the second copolymer layer thereby defining a third constituent polymer and a fourth constituent polymer, wherein the third constituent polymer corresponds to the first constituent polymer.

16. The method of claim 15, wherein the performing of the second DSA process includes:
selectively removing the fourth constituent polymer, leaving the third constituent polymer over the third layer; and transferring to the substrate a pattern using the third constituent polymer as a mask.

17. A method of patterning a substrate, comprising:

forming a first layer over the substrate;

forming a first copolymer layer over the first layer by a first DSA process, wherein the first copolymer layer includes a first constituent polymer and a second constituent polymer;

selectively removing the first constituent polymer from the first copolymer layer, resulting in first trenches in the first copolymer layer;

etching the first layer through the first trenches thereby forming second trenches in the first layer; and forming a second copolymer layer in the second trenches by a second DSA process, wherein the second copolymer layer includes a third constituent polymer and a fourth constituent polymer.

18. The method of claim 17, further comprising, before the forming of the second copolymer layer:

removing the first copolymer layer.

19. The method of claim 17, wherein:

the first constituent polymer corresponds to a line pattern; and the third constituent polymer corresponds to a hole pattern.

20. The method of claim 17, further comprising:

forming a pattern in the substrate corresponding to the third constituent polymer.

* * * * *